May 27, 1969 D. E. DENTON, JR 3,447,040

MICRO-ELEMENT CARRIER-CONNECTOR

Filed March 10, 1967 Sheet 1 of 3

INVENTOR
DON E. DENTON, JR.

BY Browne, Schuyler & Beveridge

ATTORNEYS

May 27, 1969 D. E. DENTON, JR 3,447,040

MICRO-ELEMENT CARRIER-CONNECTOR

Filed March 10, 1967 Sheet 2 of 3

INVENTOR
DON E. DENTON, JR.

BY Browne, Schuyler & Beveridge

ATTORNEYS

INVENTOR
DON E. DENTON, JR.
BY
Brown, Schuyler & Beveridge
ATTORNEYS

United States Patent Office 3,447,040

Patented May 27, 1969

3,447,040
MICRO-ELEMENT CARRIER-CONNECTOR

Don E. Denton, Jr., Huntsville, Ala., assignor, by mesne assignments, to Brown Engineering Company, Inc., a corporation of California Filed Mar. 10, 1967, Ser. No. 622,154
Int. Cl. H02b 1/04
U.S. Cl. 317—101 27 Claims

ABSTRACT OF THE DISCLOSURE

This invention is an improvement over prior art apparatus providing a carrier-connector block assembly for mounting micro-circuits on a circuit board in that it adapts such carrier-connectors to use with circuit boards above and below the block and further adapts carrier-connectors of this type to use with cold-wrap connections where external wires are to be connected to the terminals of the carrier-connector without the use of solder connections. Hook connections within the upper and lower faces of such a terminal block are extended to both upper and lower faces.

Integrated circuits and other micro-circuits comprise miniature components or micro-components variously interconnected in which connections made by conventional means are impracticable in size and complexity, requiring new approaches both as to method of connection and means of mounting. It has previously been proposed to interconnect electronic components mounted on a rigid circuit board by means of an insulator block having removable spring contact elements to correspond to conductor leads of the circuit board. Patent application Ser. No. 433,331, filed Feb. 17, 1965, now Patent No. 3,311,790, for "Micro-Module Connector and Assembly" illustrates one form of connector for mounting micro-elements where connections are made to a circuit board beneath the insulator block on which the micro-modules or circuit components are mounted. The present invention greatly extends the utility of the basic carrier by adapting it to close packing requirements where multiple circuit boards are required and for more critical space requirements in a new packaging concept.

Illustrated in the aforesaid application the insulator block has peripheral channels leading from each contact position on the upper surface of the block to a corresponding contact position therebeneath, the channels being paired at the sides of the block. Heat sinks and other component lead interconnections therein described may, of course, be included to enhance the performance of the assembly as a whole. Peripheral slots there described each contain a spring-contact element extending from a component lead position at the top of the block around the adjacent side to a position therebeneath for engagement with one contact strip on a circuit board. A hooked member makes a spring engagement with a component lead and a conductor at the upper surface of a circuit board, and is retained in place by an inwardly beveled upper shoulder and a corresponding shoulder in the slot above the circuit board. Exterior connection is made by the contact element bent back upon itself in a position to engage the circuit board exteriorly of the slot in which it is thus springedly retained. Such an arrangement is satisfacory for mounting, holding and protecting micro-components on circuit boards.

However, many applications for micro-components require attachment to multiple circuits and apparatus where packing density required makes duplication of connectors impracticable. Only two circuit boards are connectable to each carrier of that arrangement. Provision for more connections per carrier is required. Laborious and time-consuming operations are involved in the hand loading of prior connector-carriers, whereas a machine loading is desired and a more rapid, less skilled operation to use lower cost personnel is needed in lieu of hand loading of carrier-connectors.

An object of this invention is to provide improved connector-carriers adapted for much more rapid machine and/or hand assembly.

It is also an object of the invention to improve versatility of connecting means between micro-circuits on a carreir-connector and external circuitry including, but not limited to, circuit board connections.

Other objects of the invention are to provide a structure permitting four circuit boards to be clamped to the same carrier-connector and to provide a carrier-connector adapted to machine wrapping of lead wires to connector elements.

A further object is to provide a more versatile carrier-connector having a higher density of component packaging, the components being replaceable without soldering of connection. These and other objects of the invention will be better understood as the description proceeds in connection with the drawings in which.

Objects of this invention are achieved by use of a micro-element carrier with a modification of the carrier upper surface to receive a circuit board thereon and by provision of other forms of connector elements to cooperate with circuit boards for connection to external circuits or by provision of cold-wrap terminals, combined with the micro-circuit carriers to form the improved carrier-connectors, and with a base panel to complete a more generally applicable micro-circuit package.

Particularly in the case of integrated circuits, provision is required for mounting components of size too small for separate mounting, each also requiring multiple connections without soldering, as by releasable pressure contact, to engage leads on the micro-circuit components. This becomes of importance when it is desired to change micro-circuit components. Under modern practice when a component of the integrated circuitry type is found defective it is usual practice to replace the entire component, involving perhaps 8 to 12 connections. In prior connectors of this type this has required removal of a similar number of individual springs by tweezers or special tools handled in a delicate and time-consuming fashion. This problem is solved according to a further aspect of the present invention by providing for disengaging simultaneously all of the spring hold-down hooks without removing any of these springs from their slots. The spring connector has been modified by providing an outwardly bowed section extending normally beyond the lateral edge of the block in which the spring element is inserted. The carrier is constructed with a generally flat lower face adaptable for engagement with a flat circuit board or a pair of circuit boards, or for mounting on an apertured panel, and may have an upper face for receiving circuit boards, upper and lower faces being adapted for high density cold-wrap connections to individual leads in certain modifications of the carrier-connector.

Figures 1, 5:
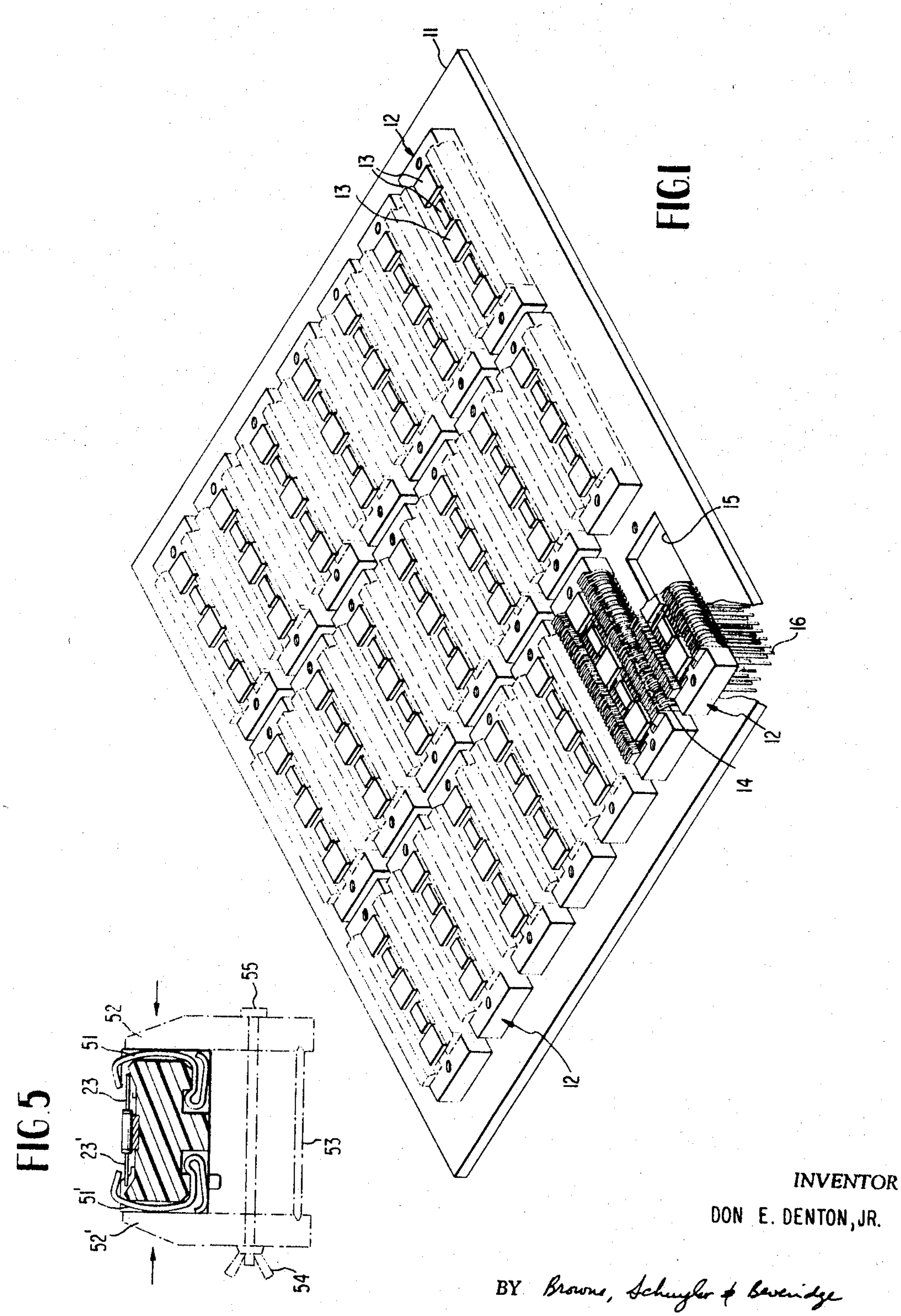
FIG. 1 is perspective view of a packaged group of carrier-connectors, illustrating solderless connections beneath a panel in one form of this invention.
FIG. 5 is a sectional view of a carrier-connector according to FIG. 4 showing spring release means and connector elements in the relased position.

Referring now more particularly to FIG. 1, there is illustrated a packaging concept according to this invention in which the density of connections made is greatly increased over conventional construction, where "density of connections" refers to the number of exterior connections which may be made per square inch of surface presented. A corresponding gain in packing factor (components per unit volume) results. In FIG. 1 a panel 11 is generally illustrated as a mounting panel or a micromodule holder having, for example, size and shape conforming to the outline of the container in which the circuit package is to be placed. Panel 11 thus constitutes a base for the mounting of a large number of micro-circuit component carriers, and illustrates one mode of use of improved micro-circuit carriers and connectors according to this invention, making use of a particular carrier form in an assembly or packaging unit.

Figure 2:
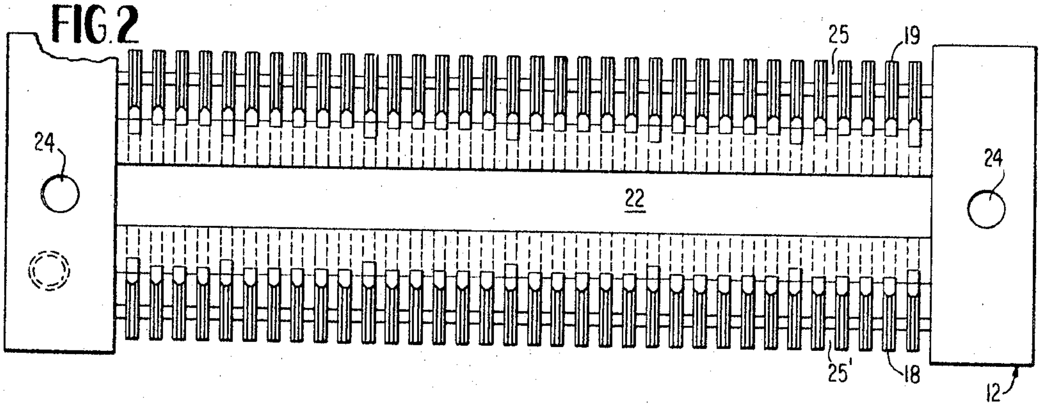
FIG. 2 is a plan view of a component carrier block according to one form of this invention.
Figure 2A:
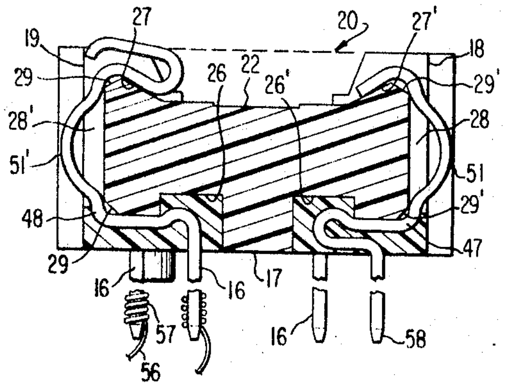
FIG. 2A is a sectional view of a carrier-connector according to the present invention showing two forms of contact element.
Figure 2B:
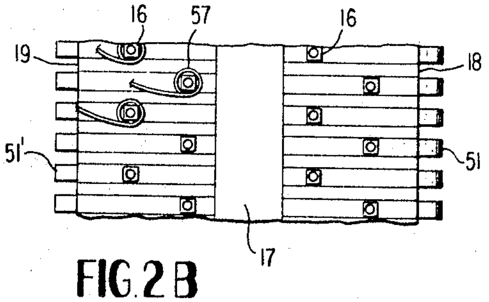
FIG. 2B is a partial bottom view of the carrier-connector illustrated in FIG. 2A.
Figure 3:
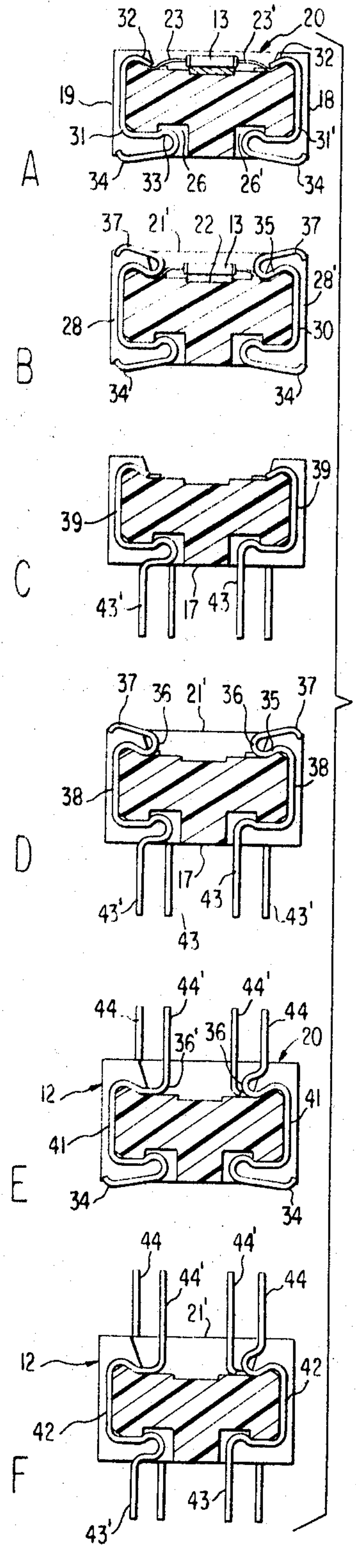
FIG. 3 is a composite of sectional views of carrier-connectors of one family according to this invention.
Figure 4:
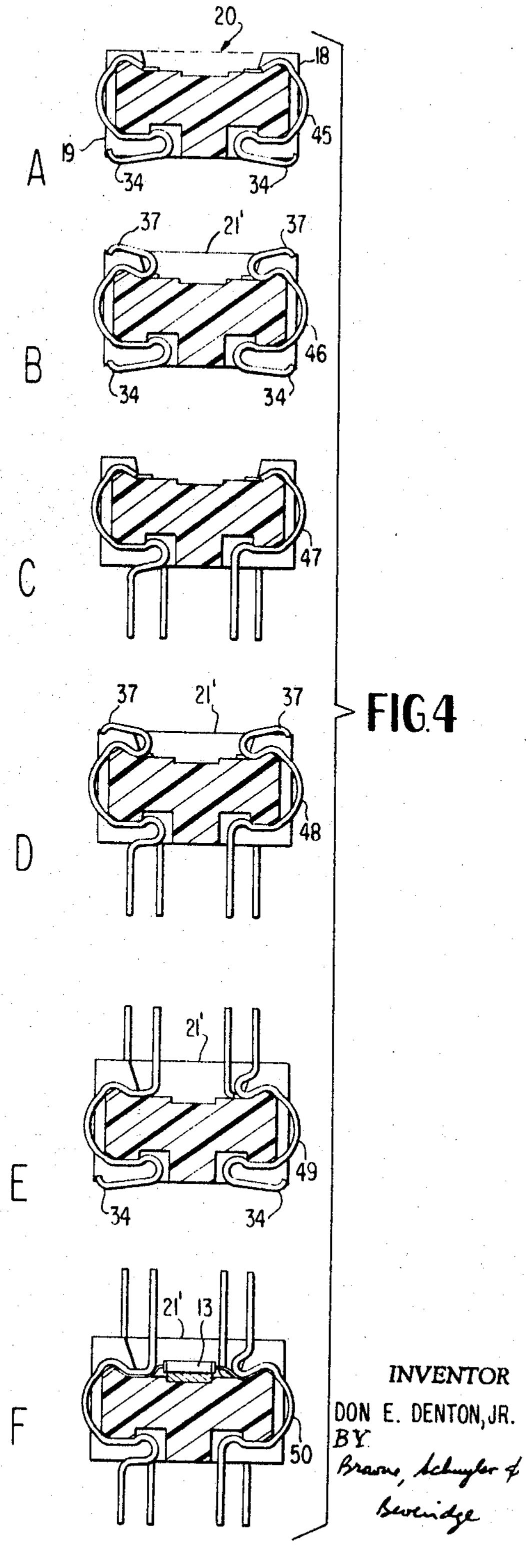
FIG. 4 is a composite of sectional views of carrier-connectors of a second family according to this invention.

Panel 11 has mounted thereon a number of micro-circuit carriers illustrated at 12 each bearing a plurality of micro-circuit components 13 having leads engaged by spring-contact members as better illustrated in FIGS. 2A, 3 and 4. Base 11 is apertured at 15 to receive extensions 16 at lower ends of contact elements 14, arranged in closely spaced array extending through the aperture 15 before connection to leads hereinafter more particularly described in connection with FIGS. 2A, 2B and 6A, 6B. The single aperture shown beneath one carrier, partly broken away, according to a packaging system as of FIG. 1, would normally be repeated as a similar aperture beneath each of the component carriers of the package.

According to the aforementioned copending patent application, carriers generally similar to carriers 12 are fitted with circuit board spring contacts permitting the mounting of such carriers on a circuit board or semi-rigid contact ribbon composed of a number of conductors extending along a rigid or flexible contact board bolted or clamped to the base of carriers 12.

FIG. 2 illustrates a suitable form of micro-element carrier having a generally flat base 17 and generally vertical sides 18 and 19 shown particularly in FIGS. 2A and 2B, and in each of the illustrations of FIGS. 3 and 4. In the modifications 3B, 4B, 3D and 4D provision is made for engagement with circuit boards along the upper surface of the carriers by providing a generally planar surface, partially interrupted, illustrated at 20, being parallel with base 17 and comprising flat-topped lands between slots later described. The end portions of carrier 12 may be flattened as illustrated in FIG. 6, where upper circuit boards need not be accommodated, having relieved portions 21 cut away below surface 20 for convenience in mounting as at 24, and having central channel 22 extending longitudinally of carrier 12. Circuit boards secured to upper surface 20 preferably are supported by raised portions 21' at the level of the lands between slots 25 to provide a more complete surface 20 for support of the circuit boards. Channel 22 is as shown in FIG. 2A to receive circuit components in a suitable disposition for connection of leads 23, 23' extending from the ends or sides of components 13 laterally from channel 22 into slot positions for engagement with contact springs. The arrangement of FIG. 2A is shown in illustration A of FIG. 3 where a component 13 has leads 23, 23' disposed laterally for engagement with contact springs, and is preferred to that of FIG. 6 since the same carrier may be applied to all modifications of carrier-connector shown in FIGS. 3 and 4. Details of the channel, orientation means, keying means, and shouldered slot adjacent the channel for receiving the contacts springs do not, per se, form a part of the present invention, and are shown to bring out the over-all improvements by which versatility of packaging and interconnection according to the invention are achieved.

Carrier 12 includes a block of insulating material, preferably of good temperature, aging, and dimensional stability, and comprises the main portion of a mounting for mico-circuits 13. Carrier 12 is formed with paired solts 25, 25' throughout the length of channel 22, which slots extend peripherally of the block from channel 22 laterally toward the sides 18 and 19, thence downwardly toward base 17, and thence toward the center of the block to terminate in recesses or wells 26, 26' arranged for retaining hooked spring-contact elements. Slots 25, 25' and recesses 26, 26' include inwardly sloped slot bottoms as at 27, 27' extending from the vicinity of channel 22 to the vertical portions of the slots at 28, 28' and are preferably chamfered at the top and bottom extremities of the slots as at 29, 29'. Such chamfering facilitates inserting spring-contact elements in the slots in tensioned engagement with shoulders therein formed at recesses 26, 26' and sloped slot bottoms 27, 27'.

In FIG. 3 illustrations labelled B, C, D, E and F show one family of improvements over a prior art unit illustrated at A. In A, a carrier block has a pair of spring-contact elements 31, 31' in which an upper spring termination 32 forms a hook engaging the bottom of the slot adjacent channel 22 and a lower hook portion 33 comprising a bent portion of the contact element formed to enter the recess 26 when the contact element is seated in the slot under tension as between hook portions 32 and 33 thus to engage shoulders at the bottom of the slot beneath the upper surface and above the lower surface. Like hook portions 32 engage leads 23, 23' from component 13. The circuit board contacting element is shown as including a contact portion 34 formed beyond the hook portion 33 of an element 31 or 31' and is an outwardly turned contact arm adapted to be depressed within the slot but to normally extend downwardly therefrom for spring engagement with a circuit board conductor. Each of the spring contact elements having a lower circuit board termination 34 is formed in a similar manner.

Illustrations B of FIG. 3 provide upper hook portions 35 shaped similar to hook 32 for the portion engaging the shoulder of the sloped slot bottom, as at 27, FIG. 2A, for clamping therebelow lead 23 or 23' of element 13. A portion 35 retains a lead in each slot at 27, 27' and holds element 13 in place within channel 22, while securing leads 23, 23' in fixed position within the slots and in electrical connection to whatever other circuitry may be connected by the contact elements. Beyond the upper hook portion 35 the element is turned back or reverse-bent as at 36 toward the adjacent lateral edge 18 or 19, and extends normally above surface 20 as a contact portion 37, in a manner similar to contact portion 34. Illustration D similarly shows contact portions 37 as turned-back extensions of contact spring elements 38. Elements 13 are assumed to be present in each of the illustrations A–F at FIG. 3 and FIG. 4, parts being alike except as noted.

In illustrations C, D and F of FIG. 3 are shown extensions of contact elements 38, 39 and 42 adapted for receiving lower end cold-wrapped connections, as more particularly illustrated in FIGS. 2A and 2B. Beyond the lower hook portion entering recess 26 the turned-back portion illustrated at 43 extends perpendicularly to the base 17, and at 43' has an offset to misalign portions 43 and 43' along the length of the carrier 12 thus to facilitate close packing of solderless connections as illustrated in 2A or 6A. Portions 43 and 43' are thus extensions of the lower hook members substantially perpendicular to the mounting base. A like arrangement of lower hook extension as shown in FIG. 3 is also found in FIG. 4, illustrations C, D and F.

In lieu of the upper circuit board contactors illustrated at 37, it is frequently desirable to make connections of the type illustrated in FIG. 1 at the top surface of the carriers rather than beneath the base panel 11. For this purpose upper hooks 32 may have a bend 36 as in illustration E with an upward extension 44 in lieu of contact portion 37, or at substantially 90° to extend above surface 20 as at 44'. In either case, the slot bottom sloped portion 27, 27' is engaged by portion 35 of the spring-contact element to form within the slot a firm contact pressure with a lead 23 or 23' placed thereunder.

Illustration F of FIG. 3 combines the downwardly pointing extensions 43, 43' with the upwardly pointing extensions 44, 44', providing the advantages of close packing of external circuit connections both above and below the carrier 12.

FIG. 4 illustrates a further improvement over the prior art support and mounting for micro-circuit components, of considerable importance in the practical work of assembling, disassembling or replacing defective units. As previously noted, circuit components having leads connected by spring hooks such as 32 or 35 are reliable and efficient means of connecting the leads in an assembly to withstand large shock and acceleration forces, while maintaining excellent assurance of contact reliability, particularly when leads and spring elements are of beryllium copper, or the like, plated with non-tarnishing alloys or metal such as gold. However, such an assembly requires removal of springs such as 31, 38, 39, 41 and 42 from the slots 25, 25' before it is possible to place component leads 23, 23' along shoulders 27, 27' within the slot bottoms for engagement by connector portions 32 and 35. This involves individual removal of a considerable number of such spring elements and their replacement one by one after a component 13 has been positioned in channel 22, and must be done each time a component is exchanged in servicing the assembly or modification thereof as need may require.

A main feature of the present invention substitutes a modified carrier-connector having provision for simultaneously releasing all spring-contact members of a particular carrier 12, or of a particular micro-circuit element in channel 22, so that replacement components may merely be slipped in place and the leads 23, 23' therefrom quickly and easily inserted underneath the upper hook portions 32 and 35. The construction making this possible is shown in detail in FIG. 2A and is applied in FIG. 4 to each of the types of connector shown in FIG. 3 being illustrated in FIG. 4 as paired like contact elements 45, 46, 47, 48, 49 and 50, which are thus modifications of corresponding contact elements of FIG. 3.

Contact elements 45–50 have external terminations substantially identical to those of FIG. 3 with the exception that bowed-out portions 51, 51' as illustrated in FIG. 2A are added. Vertical slot portions adjacent sides 18 and 19 illustrated in FIG. 3 have upper and lower portions of the spring element bottomed in the slot at the shoulders, the bottom recess, and the lateral edges of the block adjacent chamfered corners 29, 29'. Lateral pressure at upper and lower hook portions of the contact springs causes the springs to engage vertical portions of the slots adjacent 29, 29' to support tension in the spring elements binding leads 23, 23' against shoulders 27, 27'. Spring elements as in FIG. 4 are similarly held in fixed position by engagement with slot shoulder portions formed by vertical sides and inwardly and downwardly sloped slot bottoms beneath the upper surface and the recess above the lower surface, respectively. Bowed-out portions 51, 51' are formed by prebending the otherwise vertical portions of the spring-contact elements to cause the center portions thereof to extend normally beyond sides 18 and 19. Engagement with suitable clamp jaws as at 52, 52' held by a suitable fulcrum as at 53 and tensioned by clamping means, illustratively a wing nut 54 on through bolt 55, causes jaws 52, 52' to fulcrum about the support 53 into engagement with the spring-contact elements causing them to be depressed within the slots while the jaws engage the lateral sides 18 and 19. Other suitable clamping arrangements, of course, may be employed, the illustration of FIG. 5 being of a simple arrangement suitable for insertion between carriers 12 arranged as in FIG. 1. As illustrated in FIG. 5, depressing the bowed-out portions 51, 51' into the slots causes elevation of the hook portions at least at the upper end above the sloped shoulders so that leads 23, 23' may be inserted thereunder freely and without removal of the spring-contact elements from the slots. In this manner, a series of components may be released simultaneously at all leads thereof for quickly replacing or initially assembling components in carrier-connectors.

In order to provide for assembly and interconnection of a large number of micro-circuit components in a small space as in FIG. 1, it is readily apparent that insufficient conductors can be accommodated along flat conductors arrays. An assemblage such as FIG. 1 is also far too closely packed to permit solder terminals, illustratively below the aperture 15 of panel 11, and it is also seen that the close packing essential to micro-circuit technology requires that the carrier 12 be premounted on the base 11 and the extensions 16 of elements 14 passed through the aperture prior to connection to external circuitry. Soldering in such close quarters is impracticable and invariably results in poor or missed connections, as well as in the dropping of solder and flux bits which may cause short circuits rendering the entire assembly faulty, often under conditions where repair and testing may not be possible, as in a missile. To avoid this type of failure and to greatly reduce the cost as well as the space required for each connection, cold-wrapped connections have been developed in several types. One is illustrated in FIG. 2A as comprising a copper lead wire 56 wrapped around a spring contact extension 16, usually by a spin tool in a semi-automatic operation. Reliable contact is found to be predicable by employment of square or rectangular extensions 16, the corners of which are deformably engaged by convolutions 57 of wire 56 when machine-applied in a uniform and certain manner. Preferably ends 58 of extension 16 are chamfered for somewhat pointed to facilitate the placing of the spin tool thereon as generally illustrated in FIG. 2B.

FIG. 6 illustrates more in detail a form of the carrier 12 having rectangularly-shaped contact extensions 16 to which individual external leads are to be connected, and is illustrative of a carrier 12 fitted with any of the elements 45–50, showing a series of elements 47 in place as an example of a second family of carrier connectors according to this invention.

Figure 6A:
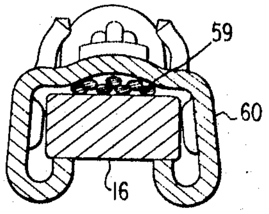
FIG. 6A illustrates a second form of cold-pressed connection to elements of FIGS. 3 and 4 as particularly shown in FIG. 6.
Figure 6:
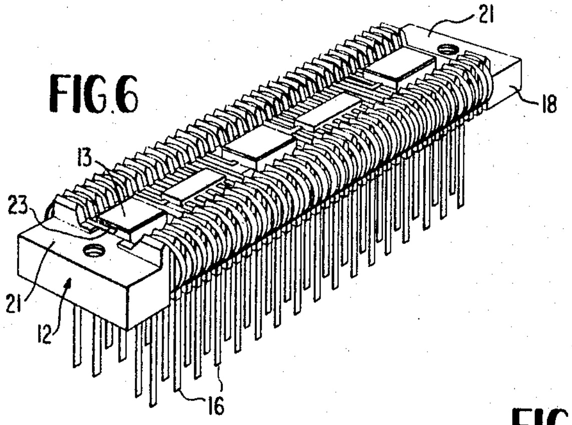
FIG. 6 is a perspective view of an assembled carrier-connector employing one contactor of FIG. 4.
Figure 6B:
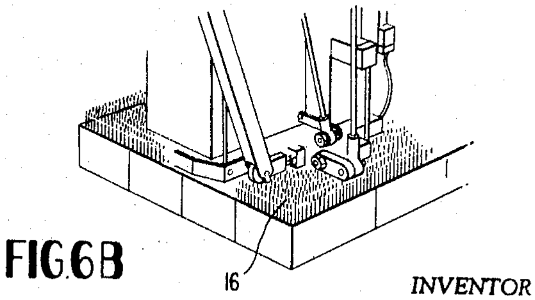
FIG. 6B illustrates one form of automatic machine for making cold-wrapping connections as in FIG. 2A for elements of FIGS. 3 and 4.

FIG. 6A illustrates another form of clamping connection between a lead such as stranded lead 59 and a contact extension 16 by means of an alternative clamping arrangement 60, also suitable for machine application. FIG. 6B illustrates a machine for automatic mechanical application of a cold-formed connection of external circuitry to closely packed contact extensions 16 protruding from a base panel such as 11.

When employing machine-wrapped terminals it will be appreciated that all protruding terminals must be accurately located within a few thousandths of an inch and must be parallel when closely spaced at equal intervals to permit proper functioning of the machine. A better operation of the machine is achieved when the contact springs are fixed in the lower recesses 26, 26' as by epoxy cement or by otherwise molding in place after assembly in the retaining slots. Advantages achieved by the modifications of FIG. 4 are retained even though the lower end of each spring contact becomes imbedded after assembly, the upper terminations being left free to springedly engage leads 23, 23' and to be elevated as in FIG. 5 for replacing components 13.

While the invention has been described in connection with particular embodiments, it will be understood that it may be otherwise practiced without departing from the scope of the invention as set forth in the following claims.

What is claimed is:

1. In a micro-circuit connector for mounting circuit components relative to a parallel flat conductor array, an elongated insulating support block arranged transversely of the conductors and including a component receptacle longitudinally within an upper face thereof dimensioned to receive said components and leads extending laterally on each side thereof, said block including upper and lower faces for receiving thereon a flat conductor array, a series of peripheral slots formed in said faces and extending from said receptacle around the lateral sides to form a deepened recess within the slot above the lower face, each slot being dimensioned to receive and position for operation one of a series of spring contact members, and a spring contact member in each of a plurality of said slots being formed to the approximate bottom contour of said slots and being hooked at the upper end to retain thereblow one said lead while extending along the slot from said receptacle to engagement with said recess and extending beyond said hooked upper end and said receptacle to terminate in free-ended contact portions above said upper face and below said lower face for engaging circuit leads of separate arrays above and below said block.

2. In a connector according to claim 1, at least some of said contact members including at one end thereof an outwardly extending cold-wrap terminal for receiving a machine-wrapped lead connection thereton.

3. In a connector according to claim 1, at least some of said contact members including a hooked upper end extended to form a circuit board spring contact arm extending normally above said upper face for engagement with conductors of a said flat conductor array positioned thereon and a circuit board spring contact arm extending normally below said lower face for engaging a said flat array positioned along the lower face.

4. In a connector according to claim 3, means for securing a circuit board in engagement with said contact members at the lower surface along at least one side thereof and a circuit board in engagement with said upper ends of the same contact members thereby to connect conductors of two circuit boards to the same micro-circuit leads.

5. A micro-circuit connector, comprising an insulating block having a generally planar base between upright sides for engaging at least on circuit board, being elongated to extend transversely across circuit board conductors for a plurality of micro-circuits and having an open channel beneath an upper face thereof extending longitudinally along the block for receiving micro-circuit components, a transverse slot at the position of each conductor to be connected extending from said channel laterally around said block to the under side thereof being generally perpendicular to said base and having shoulder means for operatively retaining a spring contact element including a deepened receptacle slot portion above said base for engaging therein a lower hooked termination of said element and a slot bottom portion below said upper face sloped downwardly toward said channel for engaging therein an upper hooked spring termination and a lead from a said component, contact spring elements including a hooked portion at each end thereof and formed around one lateral side of said block within each of a plurality of said slots to engage under tension said sloped bottom and said receptacle portion, at least some of said hooked portions further including resilient contact arms extending beyond said hooked portions and terminating in a contact spring portion beyond a said face for contact with an adjacently positioned circuit board conductor, and means simultaneously releasing said hooked portions adjacent said component, comprising a laterally bowed-out portion of said elements extending normally outward from said slots beyond said upright sides for causing elevation of the upper hooked portions above said sloped bottoms when the bowed-out portions are depressed into said slots.

6. A micro-circuit connector according to claim 5, at least some of said spring portions including an outwardly extending cold-wrap terminal for receiving a machine-wrapped lead connection thereon.

7. A micro-circuit connector according to claim 6 wherein some said cold-wrap terminals are formed on spring portions above the upper surface of said block for making cold-wrap connections.

8. A micro-circuit connector according to claim 5, said block including an upper face extending across lands between said slots to form a receiving surface for a circuit board.

9. A micro-circuit connector according to claim 8 wherein at least said upper hook portions are extended to form said resilient contact arms.

10. A micro-circuit connector according to claim 8 wherein at least said lower hook portions are extended to form outwardly extending cold-wrap terminals for receiving machine-wrapped lead connections thereon.

11. A micro-circuit assembly, comprising a mounting block of insulating material of generally rectilinear construction having a mounting surface at the bottom thereof and a receiving channel within an upper surface longitudinally of said member, said block having lateral peripheral slots for receiving spring clip members adapted to connect circuits adjacent said mounting base with circuit leads extending to the upper portion thereof in engagement with circuit leads adjacent said channel, said slots being indented beneath an upper surface of said block to include inwardly sloped bottom portions declining toward said channel for receiving said leads, said slots extending laterally from said channel and thence vertically down the block sides and inwardly from lateral edges of the block toward the central region thereof above said mounting surface to terminate in deepened recesses to form upper and lower spring retaining shoulders, a plurality of micro-circuit components each having laterally extending leads, one in each of a plurality of said slots at the sloped portions thereof, a plurality of spring connector elements each comprising an upper extension overlying said inwardly sloped portion and one said lead thereon and including a contact termination above said upper surface for engagement with an external circuit, said element extending within said slot around the lateral block edge into said deepened recess and therefrom to a termination below said surface for engagement with a second circuit lead thereat.

12. A micro-circuit assembly according to claim 11 wherein at least some of said spring connector elements in said slots comprise an outwardly bowed-out portion shaped to extend beyond the lateral edge of said mounting element when the upper and lower spring terminations engage the inwardly sloped portion and the deepened portion, respectively, of said slot, said bowed-out portion being fulcrumed at upper and lower lateral edges of the slot bottom whereby force causing depression of said bowed-out extension into said slot causes upward springing of said upper extension sufficiently to release pressure exerted on said leads within said slots.

13. An assembly according to claim 11 wherein said upper termination includes a reverse turned portion curved from said engagement with a lead upwardly and outwardly toward the lateral edge of said mounting element to lie normally above said upper surface and shaped conformably with the slot for depression fully within said slot as a circuit board is secured against said upper surface.

14. An assembly according to claim 12 wherein both said upper and lower terminations of said spring elements include turned back portions from said inwardly sloped channel bottom and from said deepened channel portion, respectively, extending toward the adjacent lateral edge of said block and being shaped for depressing into slots while normally extending above said top surface and below said mounting surface for engagement with circuit board contacts, respectively, as circuit boards are pressed thereagainst.

15. An assembly according to claim 12 in which at least some of said spring elements have terminations adapted for extending perpendicularly from the block surface for engagement with individually connected solderless leads to external circuitry.

16. An assembly according to claim 12 wherein at least some of said spring elements have a termination at one end extending vertically from said slot and a termination at the other end comprising a turned-back spring element normally lying somewhat exteriorly of said slot, being depressable thereinto as a circuit board is pressed against the surface below which said slot extends.

17. An assembly according to claim 11, wherein said upper termination includes a reverse-turned portion curved from said engagement with a lead upwardly and outwardly toward the lateral edge of said mounting element to normally lie slightly above said upper surface and shaped in conformity with the slot for depression fully within said slot as a circuit board element is pressed against said upper surface.

18. An assembly according to claim 11 wherein both said upper and lower terminations of said spring elements include turned-back portions from said inwardly sloped channel bottom and said deepened channel portion towards the adjacent lateral edge of said block, being shaped as depressable spring portions normally extending above said top surface and below said mounting surface toward engagement with circuit board contact as the circuit board is pressed thereagainst and being fully depressable thereinto as said assembly is clamped between opposed circuit board assembly.

19. An assembly according to claim 11 in which at least some of said spring elements have terminations adapted for extending perpendicularly from the block surface for engagement with individually connected solderless leads to external circuitry.

20. An assembly according to claim 11 wherein at least some of said spring elements have a termination at one end extending vertically from said slot and a termination at the other end, comprising a turned-back spring element normally lying somewhat exteriorly of said slot being depressable thereinto as a circuit board is pressed against the surface below which said slot extends.

21. An integrated circuit package, comprising a plurality of circuit components each encapsulated in a body of standardized form and having laterally extending ribbon leads

- an insulating block including upper, lower and side faces being channeled along said upper face to receive bodies of said form therein and including slots extending laterally from the channeled upper face into said lower face for receiving said leads, said slots including shoulder means above the lower face and below the upper face for retaining engagement with inwardly turned contact springs,
- springs means in said slots engaging said shoulder means and said leads for connecting said leads to exterior circuit connectors,
- means including an outwardly bowed portion of said spring means intermediate said shoulder means normally extending laterally from said slots for releasing spring engagement with said leads thereby connected in response to a lateral compressive force along said side faces, and
- connector means comprising an extension of said spring means from each end thereof beyond said shoulder means for engagement with an exterior connector.

22. A circuit package according to claim 21, comprising

- a plurality of said blocks and components,
- a base apertured to receive said connector means extending from a block, said extensions at the lower ends being shaped for solderless engagement with external lead-securing means, and
- said blocks being mounted adjacent apertures in said base with said extensions passing therethrough in spaced insulation from each other and said base.

23. A circuit package according to claim 21, said spring means being secured against displacement within said slots at the lower face by subjacent plastic encasement.

24. A circuit package according to claim 21, said spring means including at one end contact arms depressable into said slots adjacent to one said face for engagement with conductors of a circuit board clamped thereto.

25. In a micro-circuit mounting device including a rectangular block of insulating material having a lower mounting surface and an upper surface longitudinally channeled to receive a plurality of micro-circuit elements wherein said block includes a number of slots cut perpendicularly from said channel in opposite directions laterally about said block to a receptacle indentation above said mounting surface, a micro-circuit retainer and connector, comprising

- a spring element of conductive material of substantially rectangular cross-section whereof the central portion comprises a spring element of substantially C-shape encompassing at least substantially 240° of curvature including retaining hook portions engaging micro-circuits leads slotted beneath said upper surface and above said mounting surface and having extended through at least one of said surfaces terminations for engagement with a separate external circuit,
- said C-shape portion comprising means for disengaging said hook portions from said slots including outwardly bowed portions extending beyond the lateral sides of said block and shoulder means at the bottoms of said slots at upper and lower lateral edges thereof whereby inward pressure on said bowed portions causes opening of said C-shape portion to disengage said leads.

26. In a micro-circuit mounting including a generally rectangular block including a lower block mounting surface and upper surface channel to receive a plurality of micro-circuit elements each having a plurality of laterally extending flat leads for spring engagement with external circuitry said block including slots extending perpendicularly from said channel around shoulder portions at opposite edges of said block to receptacles, respectively, above the mounting surface,

- a circuit-connecting element in each of a plurality of said slots comprising a spring member tensioned to engage said shoulder portions within a slot and extending from adjacent said channel to said receptacle,
- said element terminating in an upwardly bent portion extending above said upper surface for engagement with an external circuit and extending beyond said recess portion of the slot for engagement with an external circuit,
- each said element including means for resiliently engaging one conductor of a circuit board clamped to the upper surface of said mounting block and second means for engaging one conductor of a circuit board clamped to said mounting surface to interconnect leads of the first circuit board with corresponding leads of the second circuit board.

27. In a micro-circuit mounting including a generally rectangular block including a lower block mounting surface and an upper surface channel to receive a plurality of micro-circuit elements each having a plurality of laterally extending flat leads for spring engagement with external circuitry, said block including slots extending perpendicularly from said channel around shoulder portions at opposite edges of said block to receptacles, respectively, above the mounting surface, a circuit-connecting element in each of a plurality of said slots comprising a spring member tensioned to engage said shoulder portions within a slot and extending from adjacent said channel to said receptacle, said element terminating in an upwardly bent portion extending above said upper surface for engagement with an external circuit and extending beyond said recess portion of the slot for engagement with an external circuit, and means for releasing spring tension at the upper shoulder thereof comprising a central spring portion normally bowed-out beyond the lateral side of said block while engaging said slot at said edges whereby depression of said bowed central portion within said slot causes release of spring tension at said shoulders.

References Cited

UNITED STATES PATENTS

| | | | |
|---|---|---|---|
| 3,311,790 | 3/1967 | Vizzier, et al. | 317—100 |
| 3,325,766 | 6/1967 | Kolb et al. | |
| 3,365,539 | 1/1968 | Bratsch. | |

LEWIS H. MYERS, *Primary Examiner.*

J. R. SCOTT, *Assistant Examiner.*

U.S. Cl. X.R.

339—17